United States Patent
Raynor

(10) Patent No.: US 7,358,584 B2
(45) Date of Patent: Apr. 15, 2008

(54) IMAGING SENSOR

(75) Inventor: Jeffrey Raynor, Edinburgh (GB)

(73) Assignee: STMicroelectronics Ltd., Buckinghamshire (GB)

( * ) Notice: Subject to any disclaimer, the term of this patent is extended or adjusted under 35 U.S.C. 154(b) by 233 days.

(21) Appl. No.: 11/148,930

(22) Filed: Jun. 9, 2005

(65) Prior Publication Data

US 2005/0275052 A1 Dec. 15, 2005

(30) Foreign Application Priority Data

Jun. 15, 2004 (EP) .................................. 04253557

(51) Int. Cl.
*H01L 29/76* (2006.01)
(52) U.S. Cl. ....................... 257/439; 257/440
(58) Field of Classification Search ................. 257/59, 257/72, 222, 225, E27.13, E27.133, 292, 257/293, 431, 438, 291, 390, 440, 444
See application file for complete search history.

(56) References Cited

U.S. PATENT DOCUMENTS

| 4,696,021 | A | * | 9/1987 | Kawahara et al. | ............ 377/58 |
|---|---|---|---|---|---|
| 4,794,279 | A | * | 12/1988 | Yamamura et al. | ......... 348/311 |
| 5,698,874 | A | * | 12/1997 | Hayashi | ...................... 257/233 |
| 5,850,195 | A | | 12/1998 | Berlien, Jr. et al. | ......... 341/137 |
| 7,217,967 | B2 | * | 5/2007 | Han | ............................ 257/233 |
| 2002/0050593 | A1 | | 5/2002 | Fukunaga et al. | ............ 257/53 |
| 2002/0125513 | A1 | | 9/2002 | Inoue | .......................... 257/291 |
| 2003/0218195 | A1 | * | 11/2003 | Raynor | ...................... 257/292 |
| 2005/0062078 | A1 | * | 3/2005 | Han | ............................ 257/233 |
| 2005/0145902 | A1 | * | 7/2005 | Mouli | ......................... 257/291 |
| 2005/0167707 | A1 | * | 8/2005 | Funaki | ....................... 257/291 |

FOREIGN PATENT DOCUMENTS

JP          09260715          3/1997

* cited by examiner

*Primary Examiner*—Thao P. Le
(74) *Attorney, Agent, or Firm*—Lisa K. Jorgenson; Allen, Dyer, Doppelt, Milbrath & Gilchrist, P.A.

(57) ABSTRACT

An imaging sensor includes a signal processing section, a photo-current generating and collecting section, and a separating region between the signal processing section and the photo-current generating and collecting section. The photo-current generating and collecting section includes a photodiode well having a first type of conductivity, and a contact associated with the photodiode well. A region surrounds the photodiode well, and is adjacent the separating region and has a second type of conductivity.

29 Claims, 10 Drawing Sheets

IMAGING SENSOR

FIELD OF THE INVENTION

The present invention relates to an imaging sensor, and in particular, to an imaging sensor for use in a light-to-frequency converter.

BACKGROUND OF THE INVENTION

Since the present invention relates to imaging sensors and light-to-frequency converters, it is useful at this point to briefly review the dynamic range and noise characteristics of CMOS image sensors, and the operation of a light-to-frequency converter circuit.

The dynamic range and noise characteristics of CMOS image sensors will now be discussed. Until relatively recently, charge coupled devices (CCDs) maintained a dominant position in the field of digital imaging sensors. However, recent advances in the design and fabrication of complementary metal oxide semiconductor (CMOS) chips has meant that CMOS imaging sensors are beginning to adopt a more dominant position in the low-cost imaging market.

One of the main advantages of CMOS imaging sensors is that they can be produced using standard fabrication procedures which are already widely used for producing CMOS chips for computer processors, memory chips, etc. In contrast, CCDs require optimized charge transfer efficiency, and thus specialized fabrication facilities. Consequently, CMOS imaging sensor fabrication is considerably less expensive than CCD fabrication. Furthermore, in contrast with CCDs, the signal processing and control circuitry for a CMOS imaging sensor can be integrated directly onto the CMOS chip. However, the functionality and size economy provided by the extra circuitry on CMOS imaging sensor chips comes at the cost of increased dark current.

Dynamic range is a measurement of an imaging sensors ability to capture detail across a range of lighting conditions (i.e., from dark shadows to bright lighting). More specifically, referring to equation 1, an imaging sensor's dynamic range (DR) may be defined as the ratio of the sensor's largest non-saturating current ($i_{max}$) to the smallest photo-current ($i_{min}$) detectable by the sensor.

$$DR = 20 \log_{10} \frac{i_{max}}{i_{min}} \quad (1)$$

Consequently, from equation 1 it can be seen that to increase the dynamic range of an imaging sensor it is necessary to increase $i_{max}$ and decrease $i_{min}$. However, referring to equation 2, the maximum non-saturating input current ($i_{max}$) of an imaging sensor is a function of the sensor's well capacity ($Q_{sat}$), dark current ($i_{dc}$) and integration time $t_{int}$.

$$i_{max} = \frac{qQ_{sat}}{t_{int}} - i_{dc} \quad (2)$$

Similarly, referring to equation 3, the smallest photo-current ($i_{min}$) detectable by an imaging sensor is a function of the sensor's dark current, read noise $\sigma_r^2$ and integration time.

$$i_{min} = \frac{q}{t_{int}} \sqrt{\frac{1}{q} i_{dc} t_{int} + \sigma_r^2} \quad (3)$$

From equation 2, it can be seen that the largest non-saturating input signal ($i_{max}$) of an imaging sensor can be increased by increasing the speed of the system (i.e., decreasing the integration time). However, referring to equation 3, decreasing the integration time of the imaging sensor also has the effect of increasing $i_{min}$. Thus, the approach of decreasing the integration time of an imaging sensor will produce a limited increase in an imaging sensor's dynamic range.

Another method of increasing an imaging sensor's dynamic range is to use larger photodiodes (i.e., with larger well capacity). However, this has the effect of increasing the imaging sensor's dark current $i_{dc}$ and thus increasing $i_{min}$.

Dark current is the leakage current generated at the integration node of a photo-detector in the absence of any optical signal. Dark current originates from thermally generated electron-hole pairs that produce junction and transistor leakages. Accordingly, dark current is a function of temperature and junction area.

Operation of a light-to-frequency converter circuit will now be discussed. A light-to-frequency (LTF) converter, as disclosed in U.S. Pat. No. 5,850,195 is a CMOS imaging sensor with a large dynamic range.

The LTF converter comprises a control circuit 4, at least one photodiode 6 and a current to digital signal converter 8. The control circuit 4 controls the sensitivity of the LTF converter in accordance with a number of user-controllable input signals $S_0$, $S_1$, $S_2$ and $S_3$. The current to digital signal converter 8 uses a switched-capacitor charge metering technique to convert the photo-current generated by the photodiode(s) 6 to a digital signal of a specific frequency. In order to perform this conversion process, the current to digital signal converter 8 employs a bias circuit 10, a diode multiplexer circuit 12, an amplifier circuit 14, a switched capacitor network 16, a comparator 18 and a monostable multivibrator circuit 19.

The bias circuit 10 receives a control signal from the control circuit 4 to control the sensitivity of the current to digital signal converter 8. The bias circuit 10 transmits a further control signal to the diode multiplexer circuit 12, which also receives the photo-current generated by the photodiode(s) 6. The switched-capacitor charge metering technique employed by the current to digital signal converter 8 is implemented by the amplifier circuit 14, capacitor network 16 and monostable multivibrator circuit 19.

Referring to FIG. 2, the diode multiplexer circuit 12 receives a photo-current from the photodiode 6 and employs a charge sensing amplifier circuit 20 to effectively isolate the remaining circuitry of the current to digital signal converter 8 from the large capacitance of the photodiode 6 (<100 pF). The charge sensing amplifier 20 comprises an operational amplifier 22 configured in a closed loop configuration with its non-inverting input coupled to ground and a feedback capacitor 24 connected to the inverting input.

Since the operational amplifier 22 has a high input impedance, virtually no current flows through it. Consequently, since the non-inverting input of the operational amplifier 22 is connected to ground, the inverting input becomes a virtual ground. The output of the operational amplifier 24 changes to ensure that the inverting input of the operational amplifier 24 remains at the same potential as the non-inverting input. In the process, a current flows through the feedback capacitor 22 which has the same magnitude (but opposite sign) to the photo-current generated by the photodiode) 6 ($i_{pd}$).

Equation 4 shows the relationship between the output voltage from the charge sensing amplifier 20 and the photo-current generated by the photodiode 6.

$$V_{out} = -i_{pd} \frac{T_{int}}{C_{fb}} \quad (4)$$

From the above expression it can be seen that the output voltage ($V_{out}$) from the charge sensing amplifier 20 is independent of the photodiode's 6 capacitance.

Returning to FIG. 1, the diode multiplexer circuit 12 transmits a current signal corresponding with the photo-current generated by the photodiode 6 (and processed by the charge sensing amplifier) to the amplifier circuit 14. The amplifier circuit 14 comprises at least one operational amplifier that integrates the voltage ($V_{out}$) generated from the photocurrent ($i_{pd}$). Since the closed loop gain bandwidth product of an operational amplifier is inversely related to the capacitive loading at its inputs, the significant reduction in capacitive loading provided by the diode multiplexer circuit 12 (and its charge sensing amplifier) permits the use of a lower frequency operational amplifier in the amplifier circuit 14.

Furthermore, the reduction in capacitive loading made possible by the charge sensing amplifier in the diode multiplexer circuit 12 permits the use of larger photodiodes in the event of there being more than one photodiode 6 available. However, referring to FIG. 3, the increased output of the integrating amplifier (22) will reach a maximum value and be periodically reset.

FIG. 4 shows a system used for resetting the integrating amplifier in the amplifier circuit 14. In this system, the output voltage from the amplifier circuit 14 ($V_{out2}$) is transmitted to the comparator 18 of the current to digital signal converter 8. In the comparator 18, the output voltage ($V_{out2}$) is compared against a reference voltage ($V_{ref}$). If the output voltage ($V_{out2}$) exceeds the reference voltage ($V_{ref}$), the comparator 18 transmits a control signal (Ctrl) to the monostable multivibrator circuit 19. In response to the received control signal (Ctrl), the monostable multivibrator circuit 19 emits a pulsed signal, with each pulse being used to generate a charge to discharge the integrating amplifier 22.

The charge transferred to the integrating amplifier 22 with the emission of each pulse by the monostable multivibrator circuit 19 results in an average current that is equivalent to the photodiode current $I_{pd}$. Consequently, the frequency of the control signal Ctrl is also proportional to the photodiode current $I_{pd}$ (assuming that the integrating amplifier in the amplifier circuit 14 settles completely during the period of the control signal). The control signal Ctrl is also fed to a divide-by-two circuit 30 to form the output signal from the LTF converter. Once the output voltage from the integrating amplifier ($V_{out2}$) is reduced to below the reference voltage ($V_{ref}$), the monostable multivibrator circuit 19 is disabled.

FIG. 5 shows the ti$_{min}$g of the reference voltage ($V_{ref}$), output voltage from the integrating amplifier ($V_{out2}$), the control signal (Ctrl) from the comparator 18 and the overall output signal ($F_{out}$) from the LTF converter. Since, in accordance with equation 4, the slope of the charge sensing amplifier's output is proportional to the incident light, the frequency of the output signal ($F_{out}$) from the light-to-frequency converter is also proportional to the incident light intensity. This proportionality is more clearly expressed in equation 5.

$$F_{out} = \frac{i_{pd}}{2C_{fb}(V_{ref} - V_{rt})} \quad (5)$$

The dynamic range of this system is $F_{out_{max}}$-$F_{out_{min}}$. The maximum frequency ($F_{out_{max}}$) is typically determined by the maximum operating speed of the integrating amplifier in the amplifier circuit 14, which sets the maximum slew rate (m in FIG. 5). The maximum frequency ($F_{out_{max}}$) can be relatively easily influenced by the design of the on-board operational amplifiers (e.g., by reducing the parasitic capacitance of the operational amplifiers or increasing the bias currents of the operational amplifiers). However, the minimum frequency ($F_{out_{min}}$) is typically determined by the dark current flowing through the photodiode 6.

FIGS. 6 and 7 show top plan views of conventional LTF converter circuits comprising an LTF conversion circuit section 32 and a photo-generated electron collection section 33. The LTF conversion circuitry 32 (e.g., control circuit and current to digital signal converter) comprises NMOS 34 and PMOS 36 transistors embedded in a P-well 38 and N-well 40, respectively. In FIG. 6 the photo-generated electron collection section 33 comprises a large N-well photodiode 42 surrounding an N+ contact 43. In FIG. 7, the photo-generated electron collection section 33 comprises a large N+ photodiode 44. The photodiodes 42 or 44 are to be isolated from the LTF conversion circuitry 32 by a P-well material 46. Finally, the photo-current collected from the photodiode 42 or 44 is transmitted to the LTF conversion circuitry section 32 by a metal contact 48.

These above traditional LTF converter designs typically have good light sensitivity. However, referring to FIG. 8, these devices also suffer from a large dark current because of the large photodiode junction (i.e., the boundary between the N+ 44 photodiode or N-well 42 photodiode and the P-well 46). In particular, it will be noted that the area of the photo-generated electron collection section 33 (photodiode 42/44) is equal to the area of the LTF conversion circuitry section 32. In addition, the photo-generated electron collection section 33 (photodiode 42/44) also possesses a large perimeter. These two attributes increase the dark current of a conventional LTF converter, and thereby limit the low-light performance of the device.

From the above it can be seen that while increasing the size of the photodiodes in an LTF converter increases the imaging sensor's sensitivity, it also decreases the sensor's dynamic range by increasing the photodiode's dark current.

SUMMARY OF THE INVENTION

According to the invention, an imaging sensor comprises a photo-current generating and collecting section separated from a signal processing section by a separating material, wherein the photo-current generating and collecting section comprises an N-well photodiode with an N+ contact, and the N-well photodiode is separated from the separating material by a P-epitaxial material.

Optionally, the photo-current generating and collecting section comprises a P-well photodiode with a P+ contact, and the P-well photodiode is separated from the separating material by an N-epitaxial material.

Preferably, the separating material may be an N-well. Optionally, the separating material may be a P-well. The N-well photodiode and the P-well photodiode may both be 5-10 µm in length.

According to a second aspect of the invention, an imaging sensor comprises a photo-current generating and collecting section separated from a signal processing section by a separating material, wherein the photo-current generating and collecting section comprises a plurality of N-well photodiodes with each of the plurality of N-well photodiodes being provided with an N+ contact and each of the plurality of N-well photodiodes being separated from the separating material by a P-epitaxial material.

Preferably, the separating material may be an N-well. Optionally, the separating material may be a P-well. The photo-current generating and collecting section may comprise a plurality of P-well photodiodes with each of the plurality of P-well photodiodes being provided with a P+ contact and each of the plurality of P-well photodiodes being separated from the separating material by an N-epitaxial material.

Each of the plurality of N-well photodiodes and P-well photodiodes may be 5-10 µm in length. The plurality of N-well photodiodes and P-well photodiodes may be separated from each other by distances of less than 50 µm.

The plurality of N-well photodiodes may be connected together by a metal conductor. The plurality of P-well photodiodes may be connected together by a metal conductor.

The metal conductor sums the photo-current received from the plurality of connected N-well photodiodes or the plurality of connected P-well photodiodes. The signal processing section may comprise a charge sensing amplifier.

According to a third aspect of the invention there is provided a light-to-frequency converter comprising an imaging sensor which comprises a photo-current generating and collecting section separated from a signal processing section by a separating material. The signal processing section may comprise a charge sensing amplifier and the photo-current generating and collecting section may comprise an N-well photodiode with an N+ contact. The N-well photodiode may be separated from the separating material by a P-epitaxial material.

According to a fourth aspect of the invention, an integrated circuit comprises an imaging sensor as provided in the first and second aspects of the invention. Preferably, the integrated circuit may comprise the light-to-frequency converter provided in the third aspect of the invention.

According to a fifth aspect of the invention, an optical mouse comprises an imaging sensor comprising a photo-current generating and collecting section separated from a signal processing section by a separating material. The photo-current generating and collecting section may comprise an N-well photodiode with an N+ contact, and the N-well photodiode may be separated from the separating material by a P-epitaxial material.

According to a sixth aspect of the invention, a digital camera comprises an imaging sensor comprising a photo-current generating and collecting section separated from a signal processing section by a separating material. The photo-current generating and collecting section may comprise an N-well photodiode with an N+ contact, and the N-well photodiode may be separated from the separating material by a P-epitaxial material.

According to a seventh aspect of the invention, a mobile phone comprises the digital camera as provided in the sixth aspect of the invention.

DETAILED DESCRIPTION OF THE PREFERRED EMBODIMENTS

Since dark current originates from electron-hole pair generation in the depletion layer of a reverse biased junction and minority carrier diffusion/drift near the edge of the depletion region, the present invention reduces the dark current in an imaging sensor by reducing the interfacial area between its N-well and P-well components.

Since the imaging sensor is designed for use in an LTF converter, and for the sake of clarity, the imaging sensor will be referred to as an improved dynamic range LTF converter. Similarly, since the imaging sensor employed in the second embodiment employs multiple photodiodes in an LTF converter, the second embodiment will be known as a multiple photodiode improved dynamic range LTF converter.

Figure 1:
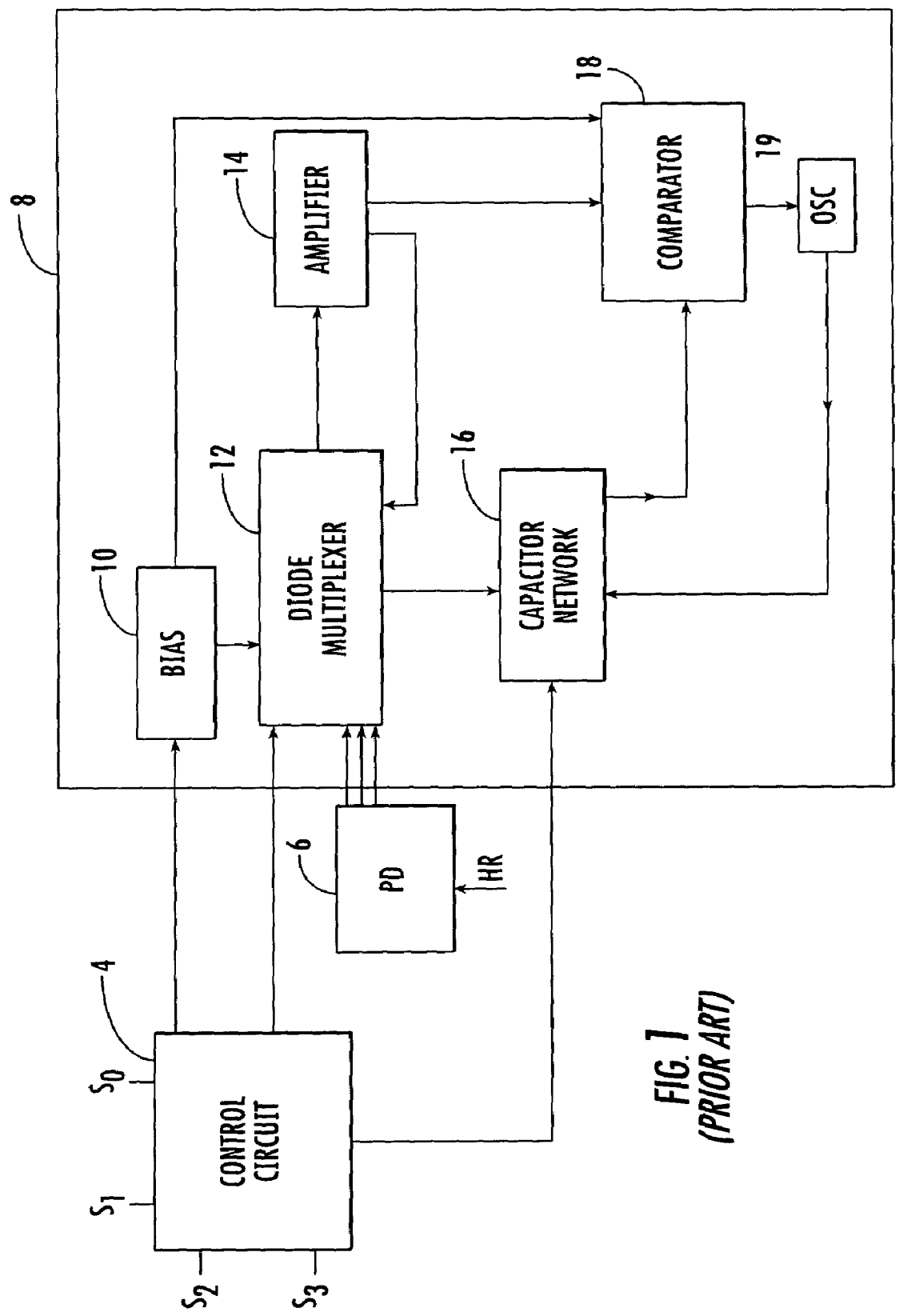
FIG. 1 is a block diagram of a LTF converter according to the prior art.
Figure 2:
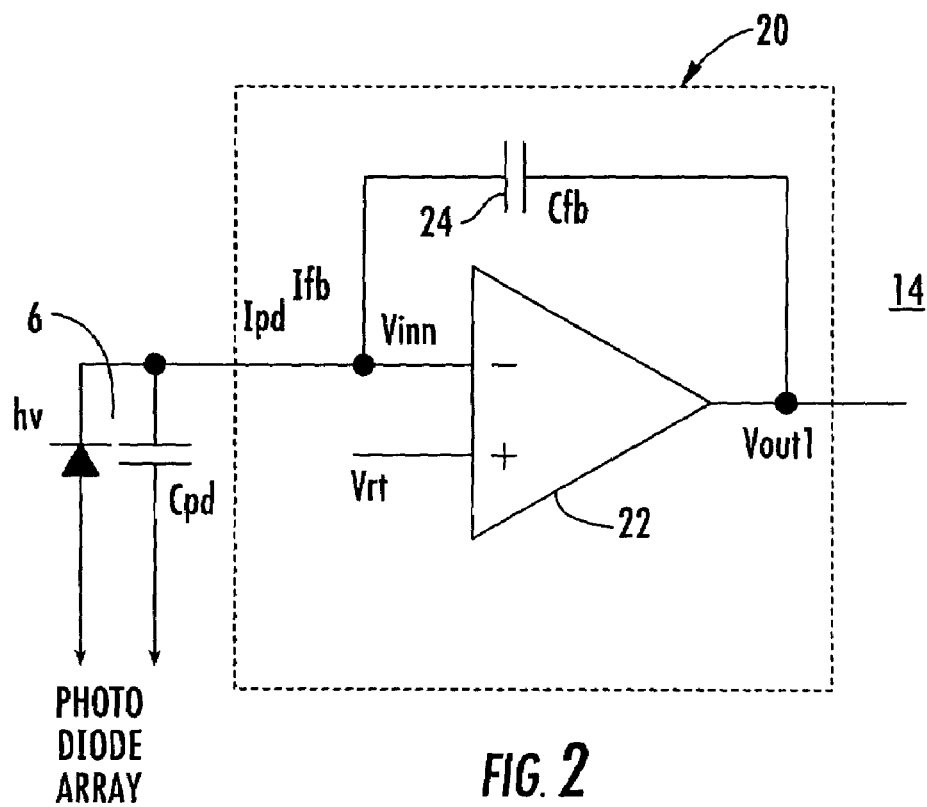
FIG. 2 is a circuit diagram of a charge sensing amplifier used in an amplifier circuit for the LTF converter according to the prior art.
Figure 3:
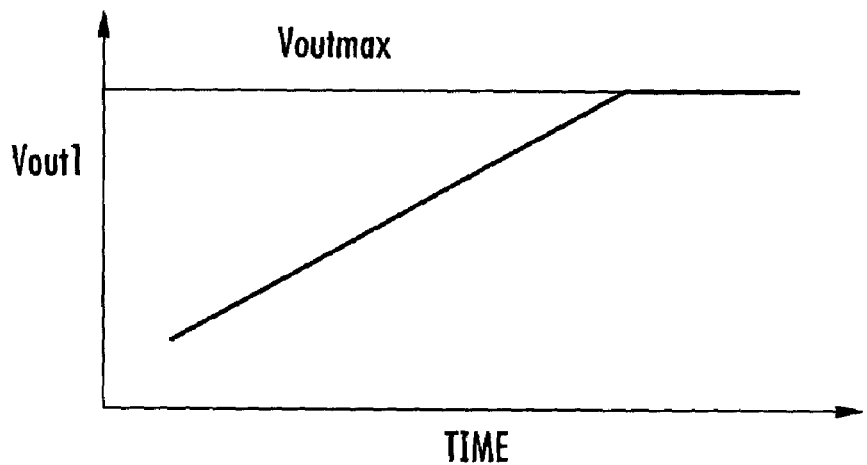
FIG. 3 is a graph of the output voltage measured from the LTF converter's amplifier circuit over a period of time during which the LTF converter is exposed to light according to the prior art.
Figure 4:
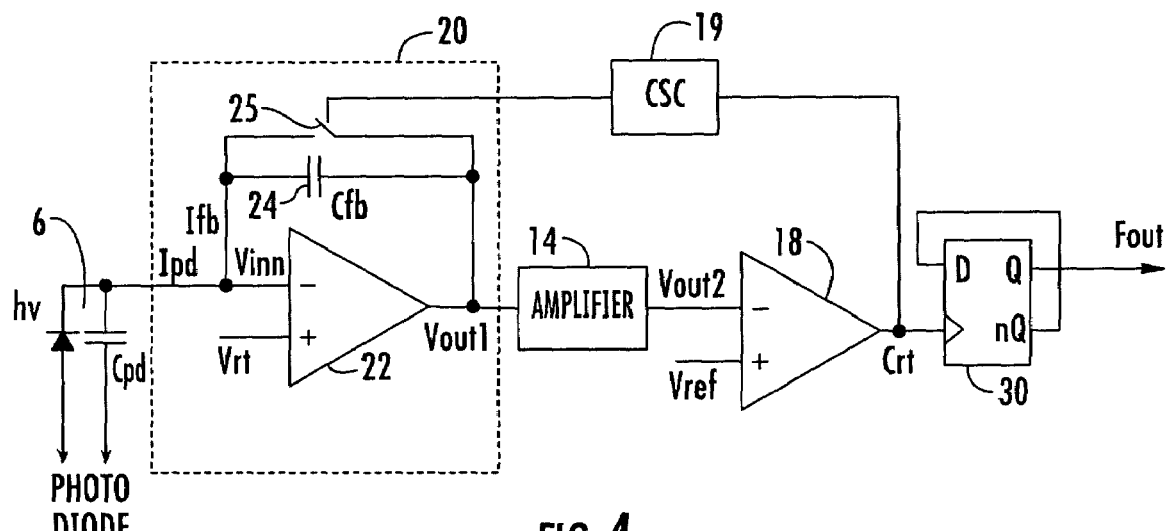
FIG. 4 is a circuit/block diagram of a number of the components of a current to digital signal converter block used in the LTF converter according to the prior art.
Figure 5:
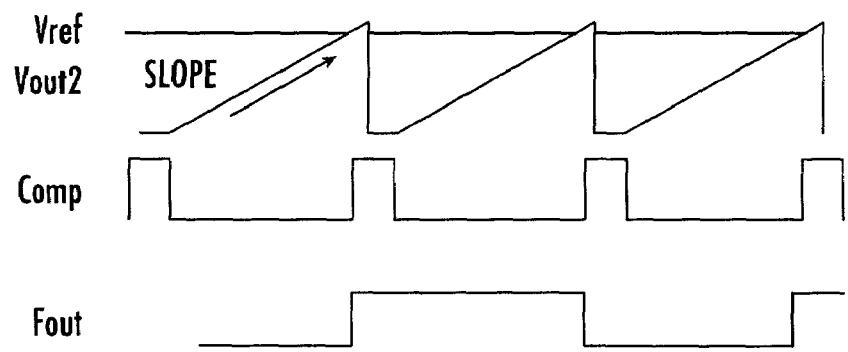
FIG. 5 is a timing diagram for the reference voltage ($V_{ref}$), output voltage from the integrating amplifier ($V_{out2}$), the control signal from the comparator (Ctrl) and the overall output signal from the LTF converter ($F_{out}$) according to the prior art.
Figure 6:
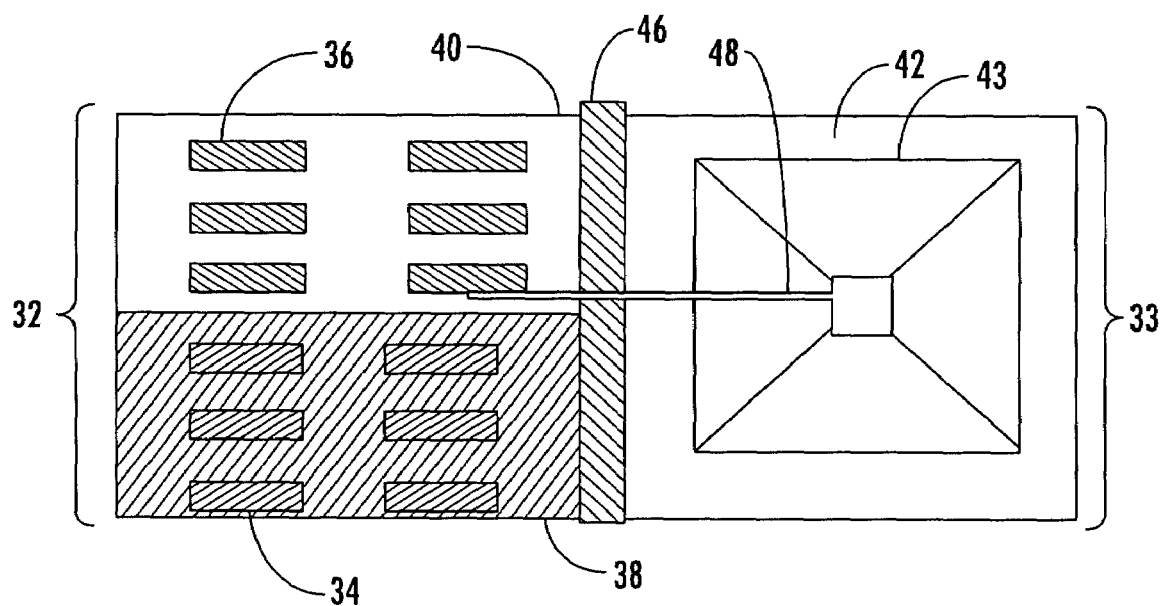
FIG. 6 is a top plan view of an N-well photodiode LTF converter according to the prior art.
Figure 7:
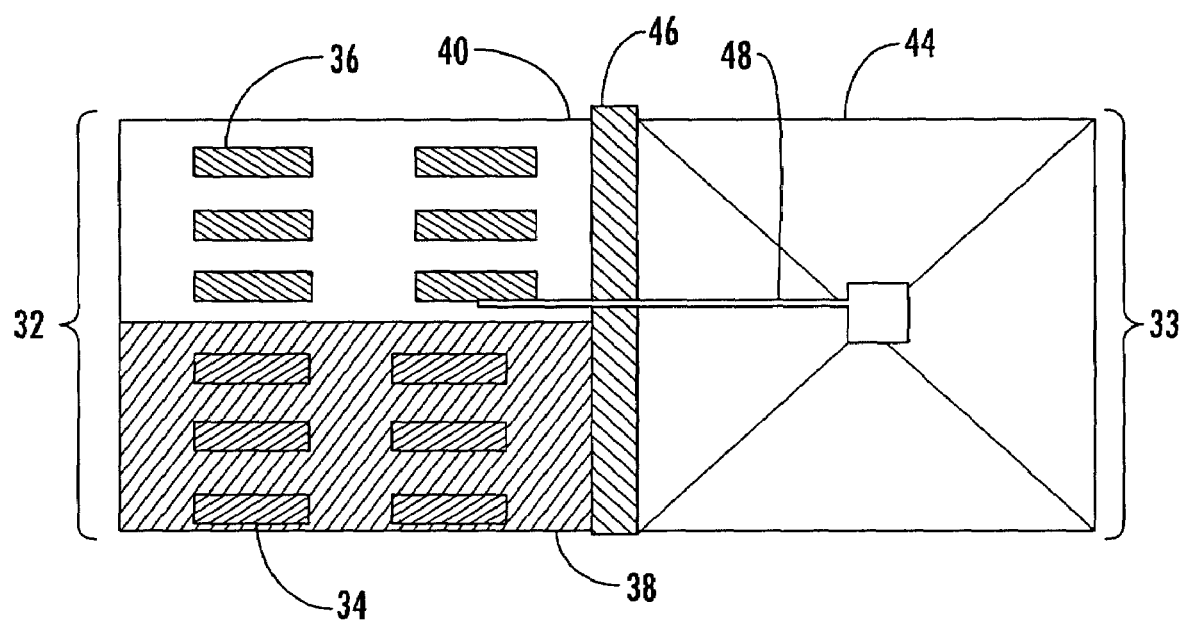
FIG. 7 is a top plan view of an N+ photodiode LTF converter according to the prior art.
Figure 8:
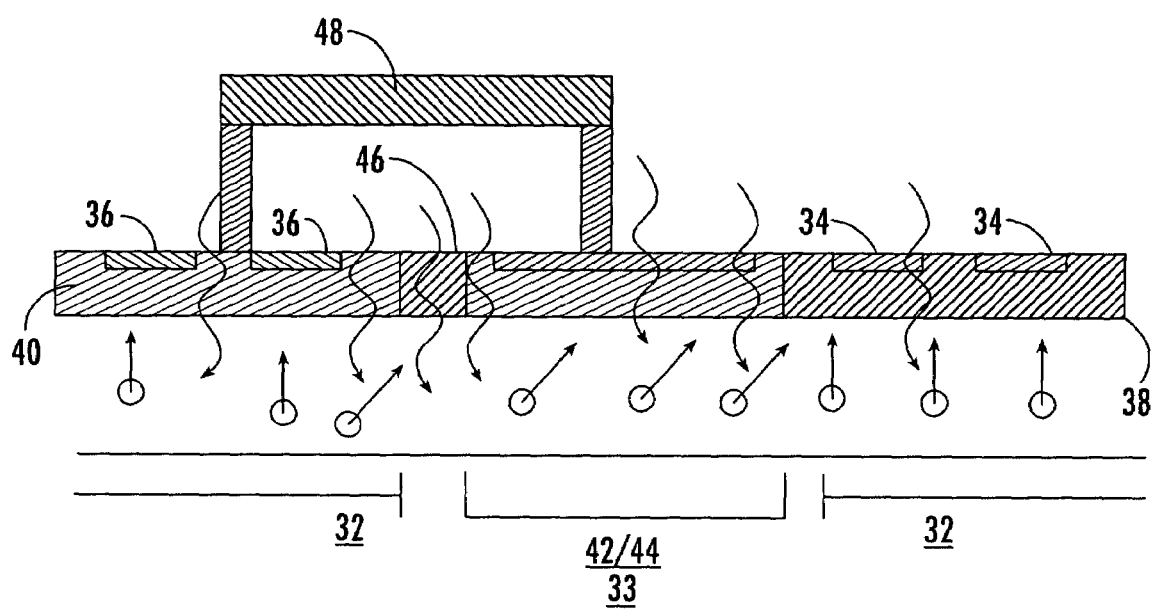
FIG. 8 is a cross-sectional view of an N-well photodiode LTF converter or an N-well photodiode LTF converter as shown in FIGS. 6 and 7.
Figure 9:
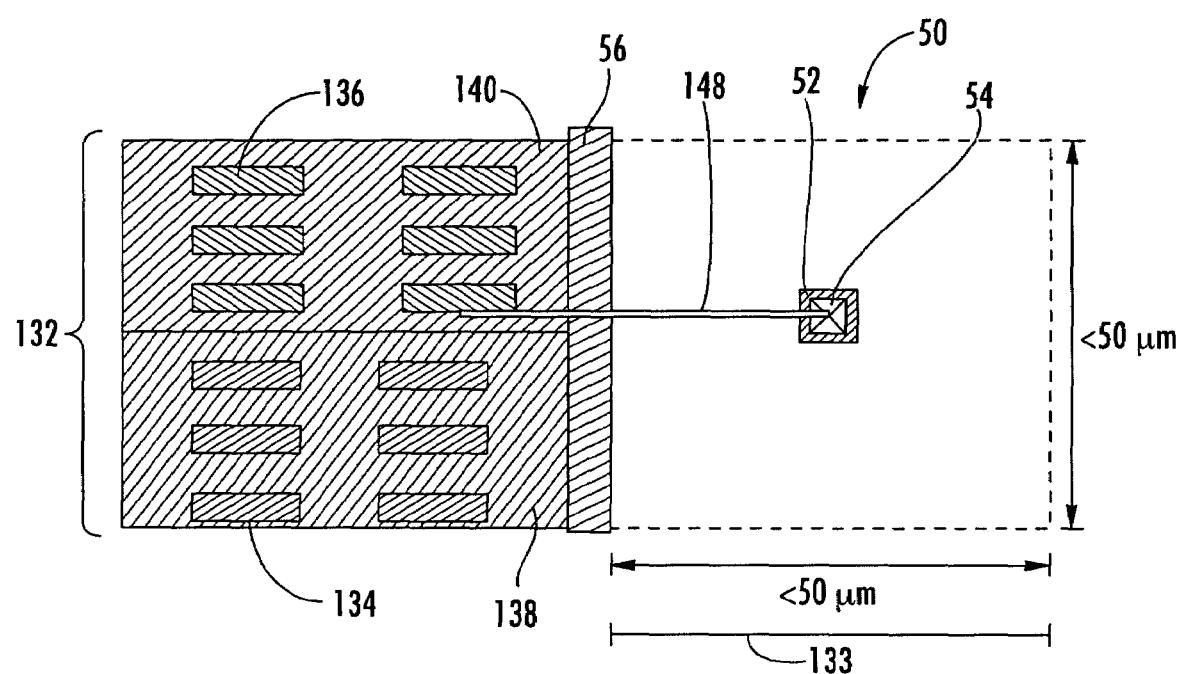
FIG. 9 is a top plan view of an imaging sensor in accordance with a first embodiment of the invention employed in an LTF converter, wherein the imaging sensor employs an N-well separation region between a N-well photodiode and an LTF conversion circuitry section.
Figure 10:
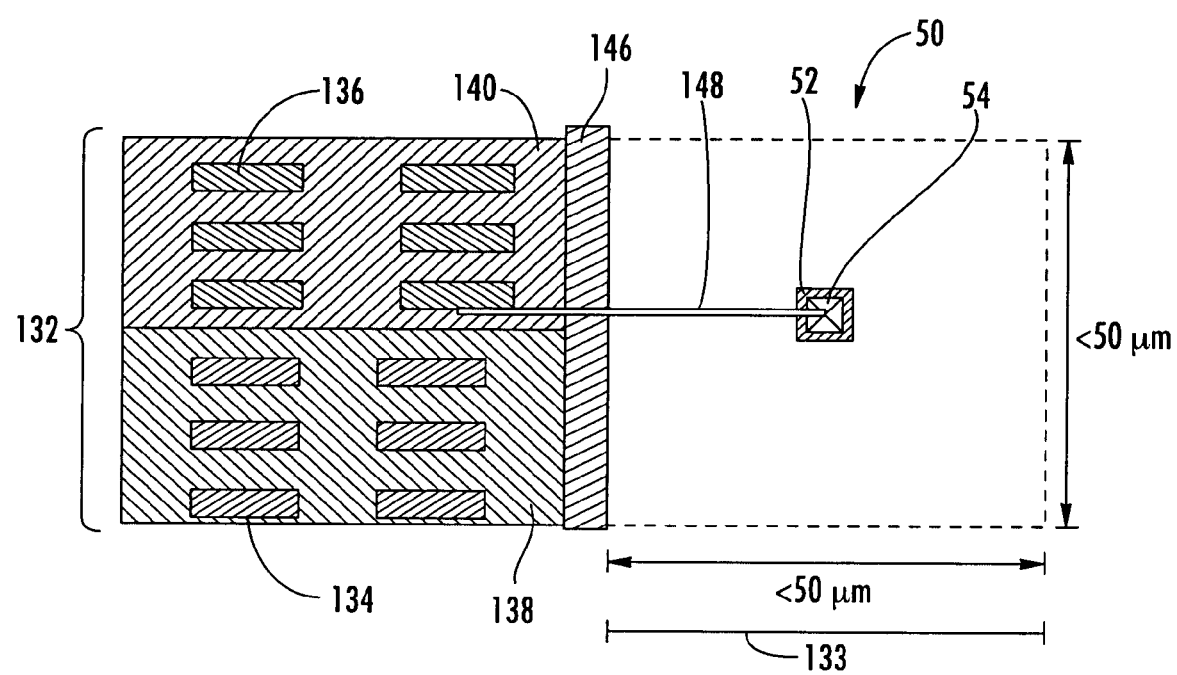
FIG. 10 is a top plan view of an imaging sensor in accordance with a first embodiment of the invention employed in an LTF converter, wherein the imaging sensor employs a P-well separation region between a N-well photodiode and the LTF conversion circuitry.

Referring to FIGS. 9 and 10, the improved dynamic range LTF converter 50 comprises an LTF conversion circuitry section 132 and a photo-generated electron collection section 133 with a metal contact 148 connected therebetween. The LTF conversion circuitry section 132 comprises NMOS 134 and PHOS 136 transistors embedded in a P-well 138 and N-well 140, respectively.

Turning to the photo-generated electron collection section 133, instead of using the large N-well or N+ photodiodes of conventional LTF converters, the improved dynamic range LTF converter 50 uses a small N-well photodiode 52 (typically 5-10 µm across) with a smaller N+ contact region 54 in its center.

Figure 11:
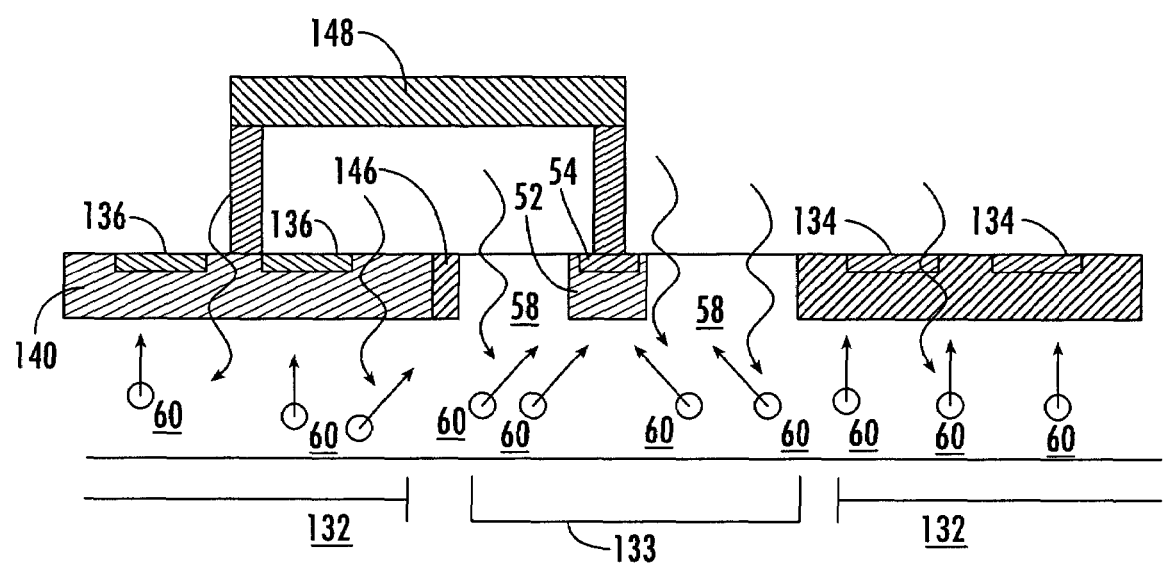
FIG. 11 is a cross-sectional view of the imaging sensor employed in an LTF converter as shown in FIG. 10.

As in the previously described conventional LTF converter, the photodiode 52 should be isolated from the LTF conversion circuitry 132 by a P-well 146 or an N-well 56. However, referring to FIG. 11, in the improved dynamic range LTF converter 50 the implantation of the P-well 146 is suppressed, leaving the high resistivity P-epitaxial material 58. With this arrangement, photo-generated charge 60 will diffuse around the pixel and will probably be collected by the N-well diode 52, especially since the operation of the LTF circuit renders the N-well diode 52 the most positive node. For optimal photo-generated charge collection, the P-well 146 is connected to ground between the N-well 140 (biased positive at VDD) and the photo-generated electron collection section 133.

The diffusion length of electrons in the P-epitaxial substrates used in modern CMOS technology is typically 30 µm-50 µm. At distances greater than this, electrons are likely to recombine and be lost within the substrate. The improved LTF converter shown in FIG. 10 does not have this problem since the photodiode 52 is smaller than 50 µm. In addition, since the collection node (contact point) 54 is located in the center of the photodiode 52, the maximum length an electron has to diffuse before it reaches the collection node 54 is (neglecting the size of the collection node) $50/\sqrt{2}=35$ µm.

As discussed above, one method of increasing the sensitivity of an imaging sensor is to increase the size of its photodiodes. However, for pixels larger than approximately 50 µm, the limited diffusion length of electrons in the P-epitaxial substrate prevents a significant proportion of photo-generated electrons from reaching a collection node.

Figure 12:
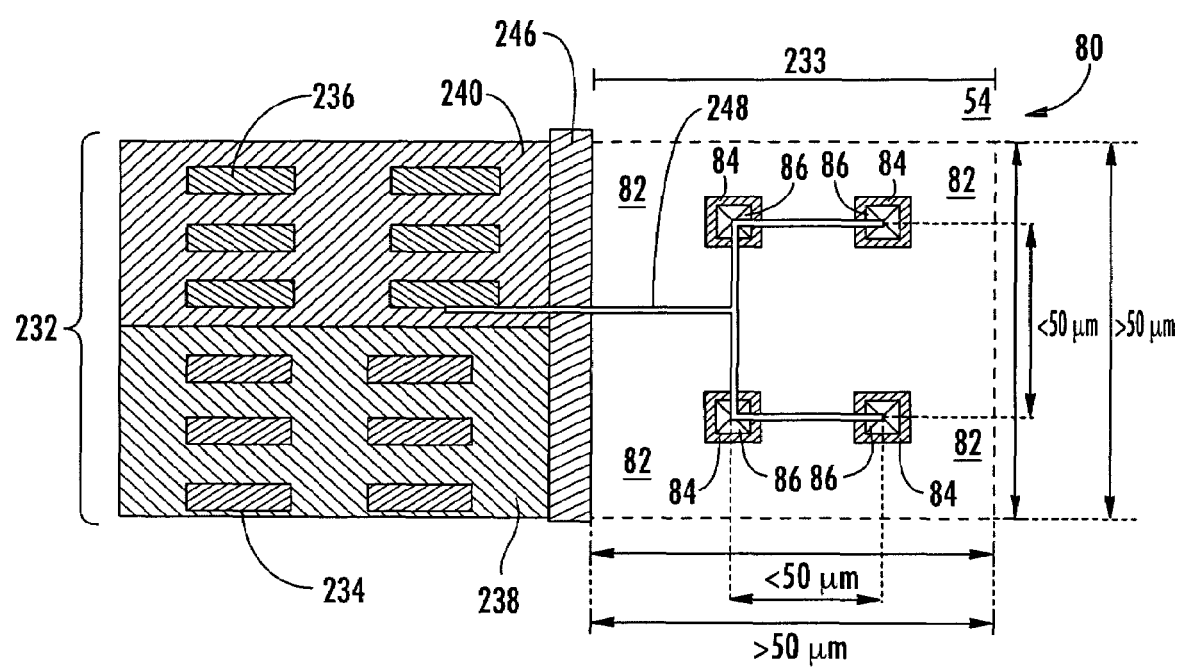
FIG. 12 is a top plan view of an imaging sensor in accordance with a second embodiment of the invention employed in an LTF converter.

FIG. 12 shows a multiple photodiode improved dynamic range LTF converter that effectively permits the use of larger, more sensitive pixels. As in the conventional LTF converter, the multiple photodiode improved dynamic range LTF converter 80 comprises an LTF conversion circuitry section 232 and a photo-generated electron collection section 233. As before, the LTF conversion circuitry section 232 comprises NMOS 234 and PMOS 236 transistors embedded in a P-well 238 and N-well 240, respectively. However, the photo-generated electron collection section 233, comprises several regularly spaced (e.g. <50 µm) collection nodes 82. In a similar fashion to the photodiodes shown in FIGS. 9-11, each of the collection nodes 82 uses a small photodiode 84 from N-well material (typically 5-10 µm across) with a smaller N+ contact region 86 in its centre.

The 5 µm-10 µm collection nodes are connected together using a metal conductor 248 that sums the photo-current. In addition, in a similar manner to conventional LTF converters, the photodiodes 82 should be isolated from the LTF conversion circuitry section 232 by a P-well 246.

By its nature, the improved dynamic range LTF converter can be readily included in an integrated circuit and is applicable to a broad range of devices including digital cameras, mobile phones incorporating a digital camera, and an optical mice. It will be appreciated that those skilled in the art may employ standard techniques to implement the invention in these and other ways. Improvements and modifications may be made to the above without departing from the scope of the invention.

That which is claimed is:

1. An imaging sensor comprising:
a signal processing section;
a photo-current generating and collecting section; and
a separating region between said signal processing section and said photo-current generating and collecting section;
said photo-current generating and collecting section comprising
at least one photodiode well having a first type of conductivity,
at least one contact associated with said at least one photodiode well, and
a region surrounding said at least one photodiode well, adjacent said separating region and having a second type of conductivity.

2. An imaging sensor according to claim 1 wherein said separation region comprises an N-well.

3. An imaging sensor according to claim 1 wherein said separation region comprises a P-well.

4. An imaging sensor according to claim 1 wherein the first type of conductivity comprises a P-type conductivity, and the second type of conductivity comprises an N-type conductivity.

5. An imaging sensor according to claim 1 wherein the first type of conductivity comprises an N-type conductivity, and the second type of conductivity comprises a P-type conductivity.

6. An imaging sensor according to claim 1 wherein said at least one photodiode well has a length in a range of about 5-10 □m.

7. An imaging sensor according to claim 1 wherein said at least one photodiode well comprises a plurality of photodiode wells.

8. An imaging sensor according to claim 7 wherein said plurality of photodiode wells are spaced apart from each other by less than 50 □m.

9. An imaging sensor according to claim 7 further comprising at least one conductor connecting said plurality of photodiode wells together so that photo-currents therefrom are summed together.

10. An imaging sensor according to claim 1 wherein said signal processing section comprises a charge sensing amplifier.

11. An electronic device comprising:
an imaging sensor comprising
a semiconductor substrate,
a signal processing section in said semiconductor substrate,
a photo-current generating and collecting section in said semiconductor substrate; and
a separating region in said semiconductor substrate between said signal processing section and said photo-current generating and collecting section,
said photo-current generating and collecting section comprising
at least one photodiode well having a first type of conductivity,
at least one contact associated with said at least one photodiode well, and
a region surrounding said at least one photodiode well, adjacent said separating region and having a second type of conductivity.

12. An electronic device according to claim 11 wherein said separation region comprises at least one of an N-well and a P-well.

13. An electronic device according to claim 11 wherein the first type of conductivity comprises a P-type conductivity, and the second type of conductivity comprises an N-type conductivity.

14. An electronic device according to claim 11 wherein the first type of conductivity comprises an N-type conductivity, and the second type of conductivity comprises a P-type conductivity.

15. An electronic device according to claim 11 wherein said at least one photodiode well has a length in a range of about 5-10 □m.

16. An electronic device according to claim 11 wherein said at least one photodiode well comprises a plurality of photodiode wells.

17. An electronic device according to claim 16 wherein said plurality of photodiode wells are spaced apart from each other by less than 50 □m.

18. An electronic device according to claim 16 further comprising at least one conductor connecting said plurality of photodiode wells together so that photo-currents therefrom are summed together.

19. An electronic device according to claim 11 wherein said signal processing section comprises a charge sensing amplifier.

20. An electronic device according to claim 11 wherein the imaging sensor is integrated within at least one of a light-to-frequency converter, an optical mouse, a mobile phone and a digital camera.

21. A method for making an imaging sensor comprising:
forming a signal processing section;
forming a photo-current generating and collecting section; and
forming a separating region between the signal processing section and the photo-current generating and collecting section,
forming the photo-current generating and collecting section comprising
forming at least one photodiode well having a first type of conductivity,
forming at least one contact associated with the at least one photodiode well, and
forming a region surrounding the at least one photodiode well, adjacent the separating region and having a second type of conductivity.

22. A method according to claim 21 wherein the separation region comprises at least one of an N-well and a P-well.

23. A method according to claim 21 wherein the first type of conductivity comprises a P-type conductivity, and the second type of conductivity comprises an N-type conductivity.

24. A method according to claim 21 wherein the first type of conductivity comprises an N-type conductivity, and the second type of conductivity comprises a P-type conductivity.

25. A method according to claim 21 wherein the at least one photodiode well has a length in a range of about 5-10 □m.

26. A method according to claim 21 wherein the at least one photodiode well comprises a plurality of photodiode wells.

27. A method according to claim 26 wherein the plurality of photodiode wells are spaced apart from each other by less than 50 □m.

28. A method according to claim 26 further comprising forming at least one conductor connecting the plurality of photodiode wells together so that photo-currents therefrom are summed together.

29. A method according to claim 21 wherein the signal processing section comprises a charge sensing amplifier.

* * * * *

UNITED STATES PATENT AND TRADEMARK OFFICE
CERTIFICATE OF CORRECTION

PATENT NO.        : 7,358,584 B2                                            Page 1 of 1
APPLICATION NO.   : 11/148930
DATED             : April 15, 2008
INVENTOR(S)       : Jeffrey Raynor It is certified that error appears in the above-identified patent and that said Letters Patent is hereby corrected as shown below:

Column 3, Line 62       Delete: "$ti_{ming}$"
                        Insert: --timing--

Column 6, Line 15       Delete: "$ti_{ming}$"
                        Insert: --timing--

Column 6, Line 64       Delete: "PHOS"
                        Insert: --PMOS--0

Signed and Sealed this

Seventh Day of October, 2008

JON W. DUDAS
*Director of the United States Patent and Trademark Office*

UNITED STATES PATENT AND TRADEMARK OFFICE
CERTIFICATE OF CORRECTION

PATENT NO. : 7,358,584 B2  
APPLICATION NO. : 11/148930  
DATED : April 15, 2008  
INVENTOR(S) : Jeffrey Raynor Page 1 of 1

It is certified that error appears in the above-identified patent and that said Letters Patent is hereby corrected as shown below:

Column 8, Line 27 Claim 6  Delete: "□m"  
Insert: --µm--

Column 8, Line 33 Claim 8  Delete: "□m"  
Insert: --µm--

Column 9, Line 7 Claim 15  Delete: "□m"  
Insert: --µm--

Column 9, Line 13 Claim 17  Delete: "□m"  
Insert: --µm--

Column 10, Line 20 Claim 25  Delete: "□m"  
Insert: --µm--

Column 10, Line 27 Claim 27  Delete: "□m"  
Insert: --µm--

Signed and Sealed this

Fourth Day of November, 2008

JON W. DUDAS  
*Director of the United States Patent and Trademark Office*